(12) United States Patent
Honma et al.

(10) Patent No.: US 6,977,402 B2
(45) Date of Patent: Dec. 20, 2005

(54) MEMORY DEVICE HAVING STORAGE PART AND THIN-FILM PART

(75) Inventors: Kazunari Honma, Matsudo (JP); Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/802,786

(22) Filed: Mar. 18, 2004

(65) Prior Publication Data

US 2004/0188742 A1  Sep. 30, 2004

(30) Foreign Application Priority Data

Mar. 25, 2003  (JP) ............................. 2003-081671

(51) Int. Cl.[7] .................... H01L 29/76; H01L 29/94; H01L 31/062; H01L 31/113; H01L 31/119
(52) U.S. Cl. .................. 257/295; 257/296; 257/303; 257/306; 257/310
(58) Field of Search .............................. 257/295–300, 257/303–313; 438/254, 397

(56) References Cited

U.S. PATENT DOCUMENTS 6,249,014 B1 *  6/2001  Bailey ........................ 257/295

FOREIGN PATENT DOCUMENTS

JP  2001-210795  8/2001
JP  2002-299579  10/2002

* cited by examiner

*Primary Examiner*—Thien F. Tran
(74) *Attorney, Agent, or Firm*—Arent Fox PLLC

(57) ABSTRACT

A memory includes a first electrode film, a storage material film formed on the first electrode film, provided with a storage part and a thin-film part having a thickness smaller than a thickness of the storage part and which is at least about 15% of the thickness of the storage part on average, a second electrode film formed on the storage part of the storage material film. The thickness of the thin-film part may be between 15% and 95% of the thickness of the storage part. An insulator film may be formed on the thin-film part and the second electrode part, the insulator film formed on the thin-film part having a same pattern as the thin-film part.

11 Claims, 8 Drawing Sheets

MEMORY DEVICE HAVING STORAGE PART AND THIN-FILM PART

BACKGROUND OF THE INVENTION

1. Field of the Invention

The present invention relates to a method of fabricating a memory and a memory, and more specifically, it relates to a method of fabricating a memory including a storage material film such as a ferroelectric film or a colossal magnetoresistance (CMR) film and a memory.

2. Description of the Background Art

In general, a device having a ferroelectric film is expected for application to various fields such as that of electronics, due to characteristics such as ferroelectricity. For example, a nonvolatile ferroelectric memory utilizing polarization hysteresis or the like is studied. For example, Japanese Patent Laying-Open No. 2001-210795 discloses such a ferroelectric memory. A nonvolatile memory utilizing a colossal magnetoresistance material whose resistance is remarkably varied with pulse application of a voltage or the like is also proposed in general. The nonvolatile memory employing a colossal magnetoresistance material holds data through variation in the resistance value of a colossal magnetoresistance material film held between upper and lower electrodes.

A nonvolatile memory employing a ferroelectric film holds data by spontaneous polarization of a ferroelectric material held between upper and lower electrodes. A one-transistor one-capacitor ferroelectric memory having memory cells each constituted of one ferroelectric capacitor and one switching transistor is known as such a ferroelectric memory. In the one-transistor one-capacitor ferroelectric memory, however, switching transistors must be arranged on the respective memory cells, and hence it is disadvantageously difficult to improve the degree of integration. To this end, a nonvolatile memory consisting of a simple matrix (cross-point) ferroelectric memory having memory cells each constituted of only one ferroelectric capacitor is proposed in general. In this simple matrix ferroelectric memory, the area of each memory cell constituted of only one ferroelectric capacitor can be extremely reduced. Consequently, the degree of integration can be improved.

FIG. 16 is a sectional view showing the structure of a conventional simple matrix ferroelectric memory. Referring to FIG. 16, a lower electrode 102 is formed on a substrate 101 in the conventional simple matrix ferroelectric memory. Upper electrodes 104 are formed on prescribed regions of the lower electrode 102 through ferroelectric films 103. The lower electrode 102 is connected to word lines (not shown), for example, and the upper electrodes 104 are connected to bit lines (not shown), for example. The lower electrodes 102, the ferroelectric films 103 and the upper electrodes 104 constitute ferroelectric capacitors 110. Each memory cell is constituted of only each ferroelectric capacitor 110.

FIGS. 17 and 18 are sectional views for illustrating a process of fabricating the conventional simple matrix ferroelectric memory shown in FIG. 16. The process of fabricating the conventional simple matrix ferroelectric memory is now described with reference to FIGS. 16 to 18.

First, the lower electrode 102, a ferroelectric film layer 103 and an upper electrode layer 104 are successively deposited on the substrate 101, as shown in FIG. 17. Thereafter photoresist films 105 are formed on prescribed regions of the upper electrode layer 104. The photoresist films 105 are employed as masks for etching the upper electrode layer 104 and the ferroelectric film layer 103, thereby partially exposing the lower electrode 102. Thus, the upper electrodes 104 and the ferroelectric films 103 are patterned as shown in FIG. 18. Thereafter the photoresist films 105 are removed thereby forming the conventional simple matrix ferroelectric memory as shown in FIG. 16.

In the conventional simple matrix ferroelectric memory shown in FIG. 16, the upper electrodes 104 and the ferroelectric films 103 are so patterned in the same shapes that the ferroelectric films 103 are present not obliquely under but only immediately under the upper electrodes 104. In this case, the structure disadvantageously prevents contribution of components of the ferroelectric films 103 polarized due to electric fields transversely leaking from the upper electrodes 104. When the structure prevents contribution of components of the ferroelectric films 103 polarized due to electric fields transversely leaking from the upper electrodes 104, the quantities of remanence of the ferroelectric films 103 are reduced to reduce the strength of signals read from the ferroelectric capacitors 110. Consequently, it is difficult to improve read signal detection accuracy.

The aforementioned problem also results when the ferroelectric films 103 are replaced with colossal magnetoresistance materials. In other words, the structure prevents contribution of resistance components of the colossal magnetoresistance materials due to electric fields transversely leaking from the upper electrodes 104, to disadvantageously reduce signal detection accuracy.

In order to solve the aforementioned problem, only the upper electrode layer 104 may be etched without etching the ferroelectric film layer 103 in the step shown in FIG. 18. If only the upper electrodes 104 are patterned by etching only the upper electrode layer 104 through the photoresist films 105 serving as masks in the step shown in FIG. 18, however, chlorine-system etching gas employed for etching the upper electrode layer 104 of Pt, for example, newly disadvantageously corrodes the exposed surface portions of the ferroelectric film layer 103. If the exposed surface portions of the ferroelectric film layer 103 are corroded, the corroded portions lose the ferroelectric function, and hence it is consequently difficult to obtain components of the ferroelectric films 103 polarized due to the electric fields transversely leaking from the upper electrodes 104. This problem also arises when the ferroelectric film layer 103 is replaced with a colossal magnetoresistance material. Consequently, it is difficult to improve read signal detection accuracy.

SUMMARY OF THE INVENTION

An object of the present invention is to provide a memory capable of improving signal reading accuracy by increasing the strength of a signal read from a memory cell.

Another object of the present invention is to provide a method of fabricating a memory easily allowing fabrication of a memory capable of improving signal reading accuracy by increasing the strength of a signal read from a memory cell.

A method of fabricating a memory according to a first aspect of the present invention comprises steps of forming a storage material film on a first electrode film, forming a storage part and an etched thin-film part by partially etching the storage material film by a prescribed thickness, forming an insulator film to cover at least the thin-film part of the storage material film and patterning the insulator film and the thin-film part of the storage material film by forming an etching mask on a prescribed region of the insulator film and thereafter etching the insulator film and the thin-film part of the storage material film through the etching mask.

In the method of fabricating a memory according to the first aspect, as hereinabove described, the storage part and the thin-film part are formed by partially etching the storage material film so that a surface portion of the storage material film corroded with chlorine-based etching gas employed for etching a second electrode film formed on the storage part, for example, can be removed, whereby the thin-film part can be provided with storage characteristics against a transverse electric field from the second electrode film. Thus, the strength of a signal read from a memory cell can be so improved as to improve signal reading accuracy. Further, the etching mask and the storage material film can be prevented from coming into contact with each other by forming the insulator film to cover at least the thin-film part of the storage material film, thereafter forming the etching mask on the prescribed region of the insulator film and patterning the insulator film and the thin-film part of the storage material film. Thus, also when the etching mask is prepared from a photoresist film and the storage material film is prepared from a ferroelectric film hardly separated from the photoresist film upon contact with the photoresist film, for example, the photoresist film can be easily removed after patterning the thin-film part.

In the method of fabricating a memory according to the first aspect, the step of forming the storage part and the thin-film part preferably includes a step of partially etching the storage material film so that the thin-film part has a thickness of at least about 15% of the thickness of the storage material film on the average. According to this structure, the thin-film part can be inhibited from exposing the first electrode film due to entire etching resulting from dispersion in depositional thickness of the storage material film in a wafer plane and dispersion in etching rate. Thus, it is possible to suppress inconvenience such as a short circuit resulting from an etching compound adhering to the side surface of the storage material film when the first electrode film is exposed by etching.

In the aforementioned method of fabricating a memory including the step of partially etching the storage material film so that the thin-film part has the thickness of at least about 15% of the thickness of the storage material film on the average, the step of forming the storage part and the thin-film part preferably includes a step of partially etching the storage material film so that the thin-film part has a thickness of not more than about 95% of the thickness of the storage material film on the average. According to this structure, at least about 5% of the surface of the storage material film can be removed also when a surface portion of the storage material film is corroded with chlorine-based etching gas for etching the second electrode film formed on the storage part, whereby the corroded surface portion of the storage material film can be reliably removed.

In the aforementioned method of fabricating a memory including the step of partially etching the storage material so that the thin-film part has the thickness of at least about 15% of the thickness of the storage material film on the average, the step of forming the storage part and the thin-film part preferably includes a step of partially etching the storage material film with etching gas containing no chlorine-based gas. According to this structure, the surface of the storage material film can be prevented from inconvenience of corrosion with chlorine-based etching gas in the step of partially etching the storage material film.

The aforementioned method of fabricating a memory according to the first aspect is preferably a method of fabricating a memory further comprising a memory cell array region formed with the storage material film, a peripheral circuit region and a connecting wire for connecting the memory cell array region and the peripheral circuit region with each other, and the step of patterning the insulator film and the thin-film part of the storage material film preferably includes a step of patterning the insulator film and the thin-film part of the storage material film so that no thin-film part of the storage material film is present at least in the vicinity of a region connecting the memory cell array region and the connecting wire with each other. According to this structure, the storage material film, prepared from a hardly etched ferroelectric film, for example, may not be etched when an opening is formed in the region connecting the memory cell array region and the connecting wire with each other, whereby the opening can be easily formed.

In this case, the method of fabricating a memory may further comprise steps of forming an interlayer dielectric film covering at least a portion close to the region connecting the memory cell array region and the connecting wire with each other after patterning the insulator film and the thin-film part of the storage material film and forming an opening for connecting the memory cell array region and the connecting wire with each other by etching a prescribed region of the interlayer dielectric film. According to this structure, the opening for connecting the memory cell array region and the connecting wire with each other can be easily formed. In this case, the method of fabricating a memory may further comprise a step of connecting the first electrode film of the memory cell array region and the connecting wire with each other through the opening. According to this structure, the memory cell array region and the connecting wire can be easily connected with each other.

In the aforementioned method of fabricating a memory according to the first aspect, the step of forming the insulator film preferably includes a step of forming the insulator film having a function of inhibiting hydrogen from diffusion. According to this structure, hydrogen can be inhibited from diffusing into the storage material film from above, whereby the storage material film can be inhibited deterioration of storage characteristics resulting from diffusion of hydrogen.

In the aforementioned method of fabricating a memory according to the first aspect, the first electrode film may include a first lower electrode film and a second lower electrode film formed on the first lower electrode film. In this case, the first lower electrode film preferably has a function of inhibiting oxygen from diffusion. According to this structure, the first lower electrode film can function as an oxygen barrier film inhibiting oxygen from diffusion.

In the aforementioned method of fabricating a memory according to the first aspect, the storage material film may be either a ferroelectric film or a colossal magnetoresistance film.

A memory according to a second aspect of the present invention comprises a first electrode film, a storage material film, formed on the first electrode film, provided with a storage part and a thin-film part having a thickness, smaller than the thickness of the storage part, of at least about 15% of the thickness of the storage part on the average, and a second electrode film formed on said storage part of said storage material film.

As hereinabove described, the memory according to the second aspect is formed with the storage material film provided with the storage part and the thin-film part having the thickness smaller than the thickness of the storage part so that the thin-film part is formed by removing a surface portion of the storage material film corroded with chlorine-based etching gas employed for etching a second electrode film formed on the storage part, for example, whereby the thin-film part can be provided with storage characteristics against a transverse electric field from the second electrode film for improving the strength of a signal read from a memory cell. Thus, signal reading accuracy can be improved. Further, the thin-film part formed with the thickness of at least about 15% of the thickness of the storage material film on the average can be inhibited from exposing the first electrode film due to entire removal resulting from dispersion in depositional thickness of the storage material film in a wafer plane and dispersion in etching rate when the thin-film part is formed by partially etching the storage material film. Thus, it is possible to suppress inconvenience such as a short circuit between the first and second electrode films resulting from an etching compound adhering to the side surface of the storage material film when the first electrode film is exposed by etching.

In the aforementioned memory according to the second aspect, the thin-film part preferably has a thickness of not more than about 95% of the thickness of the storage material film on the average. According to this structure, at least about 5% of the surface of the storage material film can be removed also when a surface portion of the storage material film is corroded with chlorine-based etching gas employed for etching the second electrode film formed on the storage part, whereby the corroded surface portion of the storage material film can be reliably removed.

The aforementioned memory according to the second aspect preferably further comprises an insulator film formed to cover the second electrode film and the thin-film part of the storage material film against an etching mask employed for working the thin-film part of the storage material film. According to this structure, the etching mask and the storage material film can be prevented from coming into contact with each other by forming the etching mask on the insulator film and patterning the insulator film and the thin-film part of the storage material film. Thus, also when the etching mask is prepared from a photoresist film and the storage material film is prepared from a ferroelectric film hardly separated from the photoresist film upon contact with the photoresist film, for example, the photoresist film can be easily removed after patterning the thin-film part.

In this case, the insulator film preferably includes a film having a function of inhibiting hydrogen from diffusion. According to this structure, hydrogen can be inhibited from diffusing into the storage material film from above, whereby the storage material film can be inhibited from deterioration of storage characteristics resulting from diffusion of hydrogen.

The aforementioned memory according to the second aspect preferably further comprises a memory cell array region formed with the storage material film, a peripheral circuit region and a connecting wire for connecting the memory cell array region and the peripheral circuit region with each other, and the storage material film is preferably so patterned that no thin-film part of the storage material film is present at least in the vicinity of a region connecting the memory cell array region and the connecting wire with each other. According to this structure, the storage material film, prepared from a hardly etched ferroelectric film, for example, may not be etched when a contact hole is formed in the region connecting the memory cell array region and the connecting wire with each other, whereby the contact hole can be easily formed.

In this case, the memory further comprises an interlayer dielectric film covering at least a portion close to the region connecting the memory cell array region and the connecting wire with each other and having an opening, and the first electrode film of the memory cell array region and the connecting wire are connected with each other through the opening. According to this structure, the memory cell array region and the connecting wire can be easily connected with each other.

In the aforementioned memory according to the second aspect, the first electrode film may include a first lower electrode film and a second lower electrode film formed on the first lower electrode film. In this case, the first lower electrode film preferably has a function of inhibiting oxygen from diffusion. According to this structure, the first lower electrode film can function as an oxygen barrier film inhibiting oxygen from diffusion.

In the aforementioned memory according to the second aspect, the storage material film may be either a ferroelectric film or a colossal magnetoresistance film.

In the aforementioned memory according to the second aspect, the storage material film may be formed to cover the upper surface and the side surfaces of the first electrode film. According to this structure, the first electrode film can be prevented from application of etching damage in etching of the storage material film.

The aforementioned memory according to the second aspect may further comprise a transistor having a pair of source/drain regions and a metal plug connected to one of the source/drain regions of the transistor, and the first electrode film may be formed to come into contact with the metal plug. According to this structure, superior electric characteristics can be attained as compared with a case of connecting the metal plug and the first electrode film with each other through a wire.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
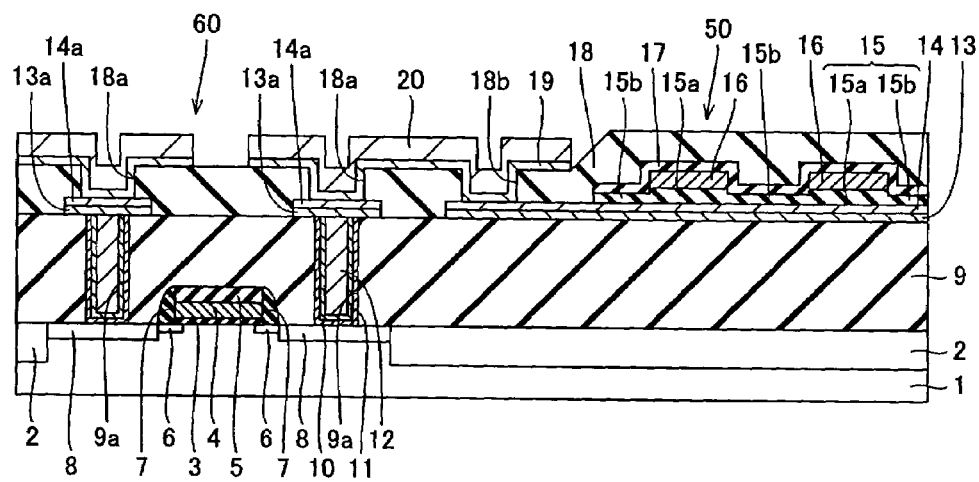
FIG. 1 is a sectional view showing a simple matrix ferroelectric memory according to a first embodiment of the present invention.

Referring to FIG. 1, a simple matrix ferroelectric memory according to a first embodiment of the present invention includes a memory cell array region 50 and a peripheral circuit region 60. Element isolation regions 2 having an STI (shallow trench isolation) structure are formed on prescribed regions of the surface of a p-type silicon substrate 1.

In the peripheral circuit region 60, a pair of high-concentration impurity regions 8 are formed on an element forming region enclosed with the element isolation regions 2 at a prescribed interval. Extension regions (low-concentration impurity regions) 6 are formed on the sides of the high-concentration impurity regions 8 closer to a channel region. The high-concentration impurity regions 8 and the extension regions (low-concentration impurity regions) 6 constitute source/drain regions. A gate electrode 4 of doped polysilicon having a thickness of about 200 nm is formed on the channel region through a gate insulator film 3 of silicon oxide having a thickness of about 5 nm. A silicon oxide film 5 having a thickness of about 150 nm is formed on the gate electrode 4. Side wall insulator films 7 of silicon oxide are formed on the side surfaces of the gate electrode 4 and the silicon oxide film 5.

An interlayer dielectric film 9 formed by successively stacking a silicon oxide film, a BPSG film and another silicon oxide film is provided to cover the overall surface. The interlayer dielectric film 9 is formed with contact holes 9a reaching the pair of high-concentration impurity regions 8. Barrier films consisting of Ti films 10 having a thickness of about 10 nm and TiN films 11 having a thickness of about 15 nm are formed in the contact holes 9a. Tungsten plugs 12 are embedded in regions enclosed with the TiN films 11.

An IrSiN film 13 having a thickness of about 100 nm is formed on a region of the interlayer dielectric film 9 corresponding to the memory cell array region 50. This IrSiN film 13 functions as an oxygen barrier film inhibiting oxygen from diffusion. A Pt film 14 having a thickness of about 100 nm is formed on the IrSiN film 13. The IrSiN film 13 and the Pt film 14 constitute a lower electrode of ferroelectric capacitors. This lower electrode is an example of the "first electrode film" in the present invention. IrSiN films 13a and Pt films 14a formed by patterning layers identical to the IrSiN film 13 and the Pt film 14 of the memory cell array region 50 are provided on the tungsten plugs 12 in the peripheral circuit region 60.

A ferroelectric film 15 of SBT ($SrBi_2Ta_2O_9$) is formed on the Pt film 14 in the memory cell array region 50. Upper electrodes 16 of Pt having a thickness of about 200 nm are formed on the ferroelectric film 15. The ferroelectric film 15 is an example of the "storage material film" in the present invention, and the upper electrodes 16 are examples of the "second electrode film" in the present invention.

According to the first embodiment, the ferroelectric film 15 is constituted of storage parts 15a, located under the upper electrodes 16, having a thickness of about 200 nm and thin-film parts 15b, located on regions other than the storage parts 15a, having a thickness of at least about 15% and not more than about 95% of the thickness of the storage parts 15a on the average.

The lower electrode consisting of the IrSiN film 13 and the Pt film 14, each storage part 15a of the ferroelectric film 15 and each upper electrode 16 constitute a ferroelectric capacitor constituting each memory cell.

According to the first embodiment, a silicon nitride film 17 is formed to cover the upper electrodes 16 and the thin-film parts 15b of the ferroelectric film 15. This silicon nitride film 17 is provided in order to prevent a photoresist film from coming into contact with the thin-film parts 15b in a step of patterning the thin-film parts 15b described later. The silicon nitride film 17 also has a function for serving as a hydrogen diffusion barrier inhibiting hydrogen from diffusion. The silicon nitride film 17 is an example of the "insulator film" in the present invention.

Another interlayer dielectric film 18 of silicon oxide is formed to cover the overall surfaces of the memory cell array region 50 and the peripheral circuit region 60. The interlayer dielectric film 18 is formed with via holes 18a and 18b. TiN films 19 having a thickness of about 15 nm are formed to come into contact with the Pt films 14a of the peripheral circuit region 60 and the Pt film 14 of the memory cell array region 50 in the via holes 18a and 18b respectively. Al films 20 having a thickness of about 200 nm are formed on the TiN films 19. The TiN films 19 and the Al films 20 constitute connecting wires for connecting the memory cell array region 50 and the peripheral circuit region 60 with each other.

According to the first embodiment, the thin-film parts 15b of the ferroelectric film 15 are patterned not to be present in the vicinity of the via hole 18b for connecting the memory cell array region 50 with the connecting wires.

Figure 2:
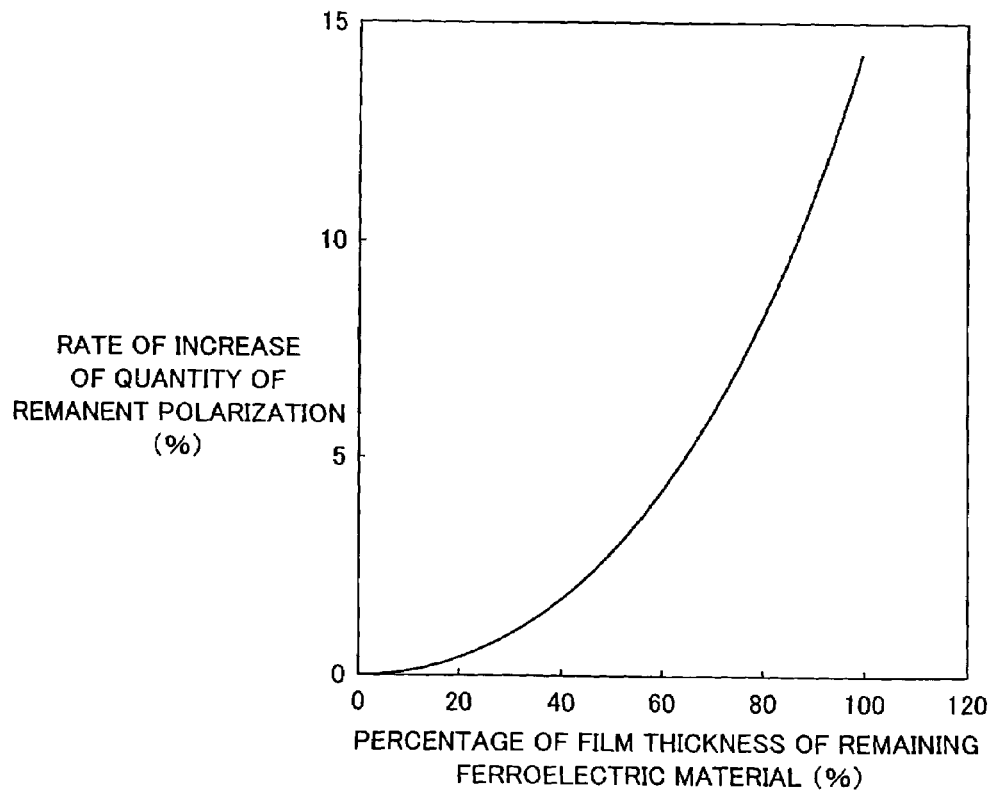
FIG. 2 is a correlation diagram showing the relation between the thickness of a thin-film part of a ferroelectric film and the quantity of remanent polarization.

The relation between the thickness of the thin-film parts 15b of the ferroelectric film 15 and the quantity of remanent polarization is now described with reference to FIG. 2. Referring to FIG. 2, the axis of abscissa shows the percentage of the thickness of the thin-film parts 15b with reference to the thickness of the storage parts 15a of the ferroelectric film 15. The axis of ordinate shows the rate of increase of the quantity of remanent polarization with respect to a ferroelectric memory (prior art) having no thin-film parts 15b. FIG. 2 also shows the rate of increase of the quantity of remanent polarization with reference to the upper electrodes 16 having a line width of 1 $\mu$m. It is understood from FIG. 2 that the rate of increase of the quantity of remanent polarization is increased in proportion to the thickness of the thin-film parts 15b. More specifically, the rate of increase of the quantity of remanent polarization is about 3% when the thickness of the thin-film parts 15b is 50% (100 nm) of the thickness (200 nm) of the storage parts 15a. When the thickness of the thin-film parts 15b of the ferroelectric film 15 is identical (100%) to the thickness of the storage parts 15a, the rate of increase of the quantity of remanent polarization is about 14%. It is understood from the graph shown in FIG. 2 that the thin-film parts 15b can be provided with a larger quantity of remanent polarization against transverse electric fields from the upper electrodes 16 as the thickness of the thin-film parts 15b is increased. As understood from the results shown in FIG. 2, the quantity of remanent polarization provided in the thin-film parts 15b against the transverse electric fields from the upper electrodes. 16 is further increased when the line width of the upper electrodes 16 is not more than 1 $\mu$m. Therefore, the line width of the upper electrodes 16 is preferably not more than 1 $\mu$m.

When the thin-film parts 15b are formed with the thickness identical to that of the storage parts 15a of the ferroelectric film 15, however, surface portions of the thin-film parts 15b corroded with chlorine-based etching gas ($Cl_2$/Ar gas) employed for patterning the upper electrodes 16 remain unremoved. In this case, the corroded surface portions of the thin-film parts 15b lose the ferroelectric function, and hence the thin-film parts 15b hardly ferroelectrically function against the transverse electric fields from the upper electrodes 16. Thus, the quantity of remanent polarization is not increased. In order to remove the corroded surface portions of the thin-film parts 15b, the surfaces of the thin-film parts 15b must be removed by at least about 5% of the thickness of the thin-film parts 15b. Therefore, the thickness of the thin-film parts 15b is preferably set to not more than about 95% of the thickness of the storage parts 15a on the average.

When the thickness of the thin-film parts 15b is set smaller than 15% of the thickness of the storage parts 15a, the thin-film parts 15b may be entirely removed to partially expose the Pt film 14 constituting the lower electrode due to dispersion in depositional thickness of the ferroelectric film 15 in a wafer plane and dispersion in etching rate. In this case, the exposed portions of the Pt film 14 are so etched that an etching compound disadvantageously adheres to the side surfaces of the storage parts 15a to short-circuit the lower electrode and the upper electrodes 16. This problem is now described in detail with reference to FIGS. 3 and 4.

Figure 3:
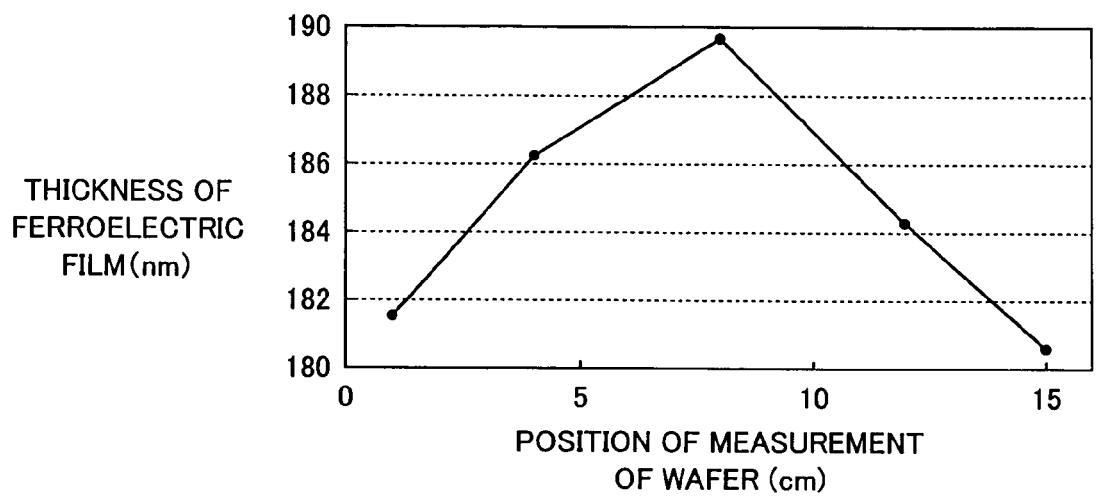
FIG. 3 is a characteristic diagram for illustrating dispersion in thickness of a ferroelectric film in a wafer plane.
Figure 4:
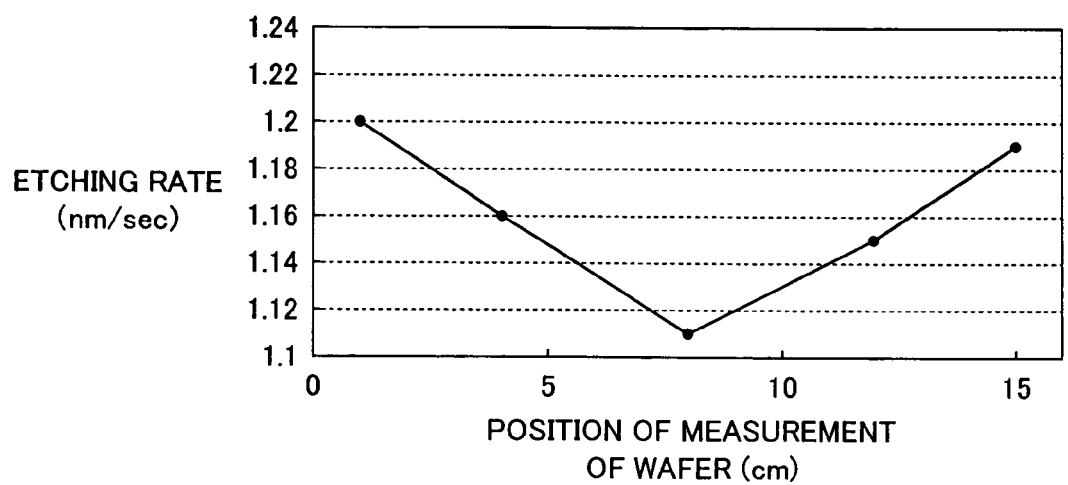
FIG. 4 is a characteristic diagram for illustrating dispersion in etching rate in the wafer plane.

It is extremely difficult to leave a ferroelectric material in the range of 0 to 15% along the overall area in a wafer plane. FIG. 3 illustrates thickness distribution in a ferroelectric film deposited on a wafer of 6 inches, and FIG. 4 illustrates in-plane dispersion of an etching rate for the ferroelectric film etched with $CF_4/Ar$ gas. As shown in FIG. 3, the ferroelectric film deposited on the wafer of 6 inches causes dispersion of about 5%. Further, the etching rate is dispersed by about 10% as shown in FIG. 4. Thus, it is understood from FIGS. 3 and 4 that the Pt film 14 constituting the lower electrode is partially etched in peripheral regions of the wafer when the thin-film parts 15b of the ferroelectric film 15 are to be left on the central portion of the wafer with a thickness smaller than about 15%. In such regions, an etching compound resulting from the Pt film 14 adheres to the side surfaces of the storage parts 15a of the ferroelectric film 15, to easily short-circuit the ferroelectric capacitors. In consideration of the dispersion in depositional thickness of the ferroelectric film and the dispersion in etching rate shown in FIGS. 3 and 4, therefore, the thickness of the thin-film parts 15b must be set to at least about 15% of the thickness of the storage parts 15a on the average.

Thus, the thickness of the thin-film parts 15b of the ferroelectric film 15 is preferably set to at least about 15% and not more than about 95% of the thickness of the storage parts 15a on the average.

According to the first embodiment, as hereinabove described, the ferroelectric film 15 provided with the storage parts 15a and the thin-film parts 15b having the thickness smaller than the thickness of the storage parts 15a is so formed that the surfaces of the thin-film parts 15b are partially removed by etching when the same are corroded with chlorine-based etching gas employed for etching the upper electrodes 16 formed on the storage parts 15a, whereby the thin-film parts 15b can ferroelectrically function against the transverse electric fields from the upper electrodes 16. Thus, the strength of signals read from the memory cells can be so improved as to improve signal reading accuracy.

According to the first embodiment, further, the thin-film parts 15b are formed with the thickness of at least about 15% of the thickness of the storage parts 15a on the average as hereinabove described, whereby the thin-film parts 15b can be inhibited from partially exposing the Pt film 14 constituting the lower electrode due to entire removal resulting dispersion in depositional thickness of the ferroelectric film 15 in the wafer plane and dispersion in etching rate when the thin-film parts 15b are formed by partially etching the ferroelectric film 15. Thus, it is possible to suppress inconvenience such as a short circuit between the lower electrode and the upper electrodes 16 resulting from an etching compound adhering to the side surfaces of the storage parts 15a when the Pt film 14 constituting the lower electrode is exposed by etching.

As shown in FIG. 1, the silicon nitride film 17 serving as an insulator film is formed to cover the surfaces of the thin-film parts 15b so that a photoresist film (etching mask) can be formed on the silicon nitride film 17 for patterning the thin-film parts 15b as described later, whereby the photoresist film can be prevented from coming into contact with the thin-film parts 15b. Thus, also when the ferroelectric film 15 is made of a material hardly separated from the photoresist film upon contact with the photoresist films, the photoresist film can be easily removed after patterning the thin-film parts 15b.

The silicon nitride film 17 having the function of inhibiting hydrogen from diffusion can inhibit hydrogen from diffusing into the ferroelectric film 15 from above. Thus, the ferroelectric film 15 consisting of an oxide can be easily inhibited from deterioration of characteristics resulting from penetration of hydrogen.

According to the first embodiment, further, the thin-film parts 15b of the ferroelectric film 15 are patterned not to be present in the vicinity of the via hole 18b for connecting the memory cell array region 50 with the connecting wires so that the ferroelectric film 15 made of a hardly etched material may not be etched in formation of the via hole 18b, whereby the via hole 18b can be easily formed.

A process of fabricating the ferroelectric memory according to the first embodiment is now described with reference to FIGS. 1 and 5 to 13.

Figure 5:
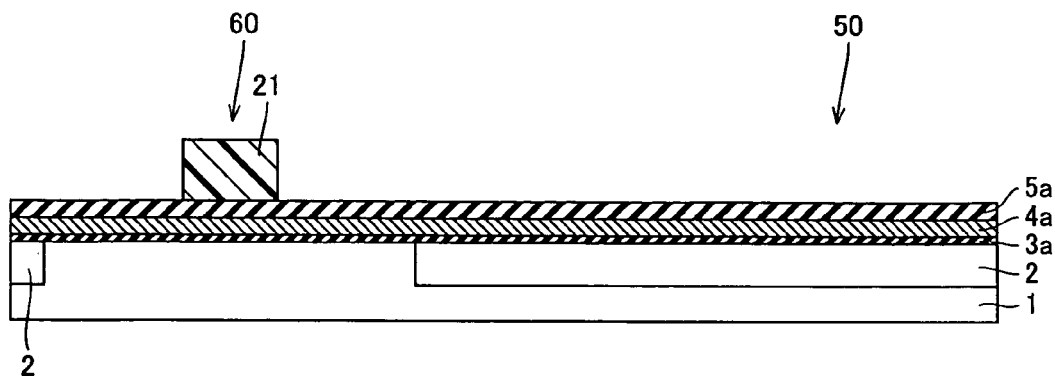
FIGS. 5 to 13 are sectional views for illustrating a process of fabricating the simple matrix ferroelectric memory according to the first embodiment shown in FIG. 1.

As shown in FIG. 5, the element isolation regions 2 of the STI structure are formed on the prescribed regions of the p-type silicon substrate 1. Thereafter n and p wells are formed by ion implantation and the thresholds of n- and p-channel transistors are adjusted by another ion implantation. Thereafter a silicon oxide film 3a is formed by thermal oxidation with a thickness of about 5 nm. A doped polysilicon film 4a is formed on the silicon oxide film 3a by CVD with a thickness of about 200 nm. Another silicon oxide film 5a is formed on the doped polysilicon film 4a by low-pressure chemical vapor deposition (LPCVD) with a thickness of about 150 nm. A photoresist film 21 is formed on a prescribed region of the silicon oxide film 5a.

Figure 6:
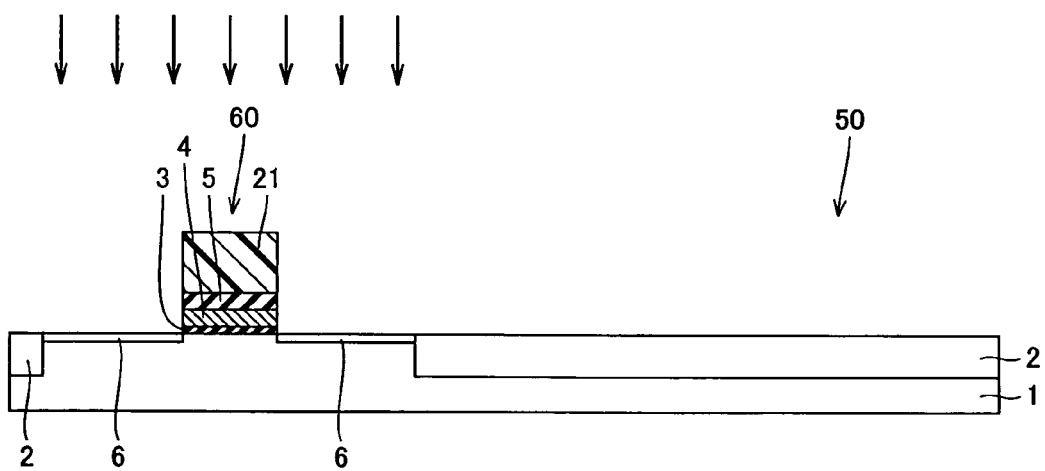

The photoresist film 21 is employed as a mask for etching the silicon oxide film 5a, the doped polysilicon film 4a and the silicon oxide film 3a, thereby forming the gate insulator film 3 of silicon oxide, the gate electrode 4 of doped polysilicon and the silicon oxide film 5 as shown in FIG. 6. Thereafter arsenic (As) ions are implanted through the photoresist film 21 under conditions of implantation energy of about 10 keV and a dose of about $1 \times 10^{14}$ cm$^{-2}$, thereby forming the n-type extension regions (low-concentration impurity regions) 6. Thereafter the photoresist film 21 is removed.

Figure 7:
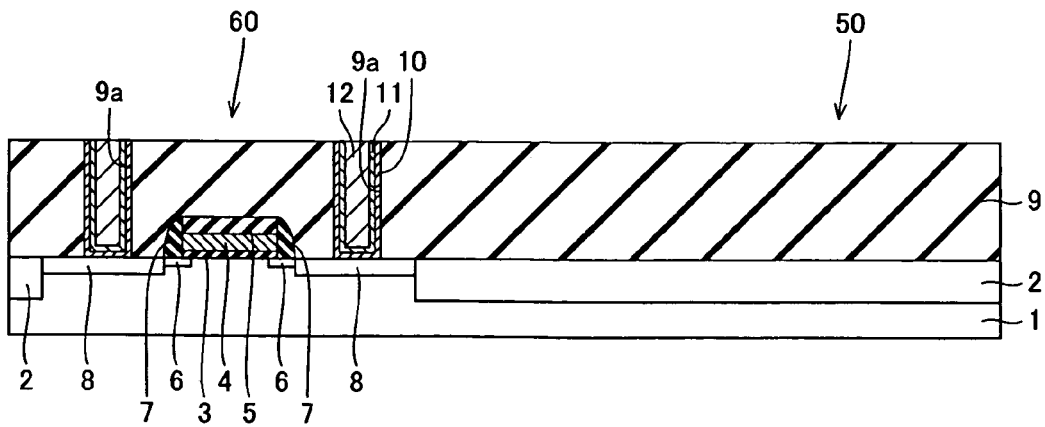

As shown in FIG. 7, a silicon oxide film (not shown) having a thickness of about 200 nm is formed on the overall surface by LPCVD and thereafter anisotropically etched thereby forming the side wall insulator films 7 on the side surfaces of the gate insulator film 3, the gate electrode 4 and the silicon oxide film 5. The side wall insulator films 7 are employed as masks for ion-implanting arsenic (As) ions under conditions of implantation energy of about 30 keV and a dose of about $1 \times 10^{15}$ cm$^{-2}$, thereby forming the high-concentration impurity regions 8. The extension regions 6 and the high-concentration impurity regions 8 constitute the source/drain regions. Thereafter heat treatment is performed in a nitrogen atmosphere at about 850° C. for about 30 minutes, in order to activate the ion-implanted impurity.

Then, another silicon oxide film is formed by LPCVD to cover the overall surface with a thickness of about 200 nm, and a BPSG film is deposited on this silicon oxide film with a thickness of about 800 nm. Heat treatment is performed in an oxygen atmosphere at about 850° C. for about 30 minutes, thereby reflowing the BPSG film. Thereafter the BPSG film is etched or polished into a desired thickness by dry etching or CMP (chemical mechanical polishing). Still another silicon oxide film is deposited on the BPSG film by LPCVD with a thickness of about 100 nm, thereby forming the interlayer dielectric film 9 having a three-layer structure of silicon oxide, BPSG and silicon oxide. The contact holes 9a reaching the high-concentration regions 8 are formed in the interlayer dielectric film 9 by photolithography and dry etching.

The Ti films 10 having the thickness of about 10 nm and the TiN films 11 having the thickness of about 15 nm are successively deposited in the contact holes 9a and on the upper surface of the interlayer dielectric film 9 by sputtering. Thereafter tungsten films 12 are deposited with a thickness of about 400 nm. Excess portions of the tungsten films 12, the TiN films 11 and the Ti films 10 located on regions other than the contact holes 9a are removed by CMP, thereby obtaining the shape shown in FIG. 7.

Figure 8:
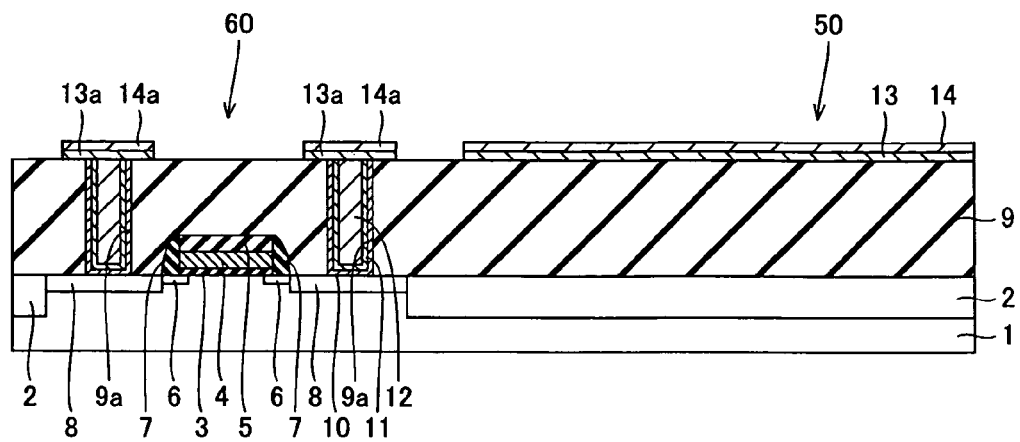

Then, an IrSiN film (not shown) having a thickness of about 100 nm and a Pt film (not shown) having a thickness of about 100 nm are successively deposited by sputtering to cover the overall surface, and thereafter patterned by photolithography and dry etching with Cl$_2$/Ar gas. Thus, the IrSiN film 13 and the Pt film 14 constituting the lower electrode are formed on the memory cell array region 50 while the IrSiN films 13a and the Pt films 14a are formed on the peripheral circuit region 60 as shown in FIG. 8.

Figure 9:
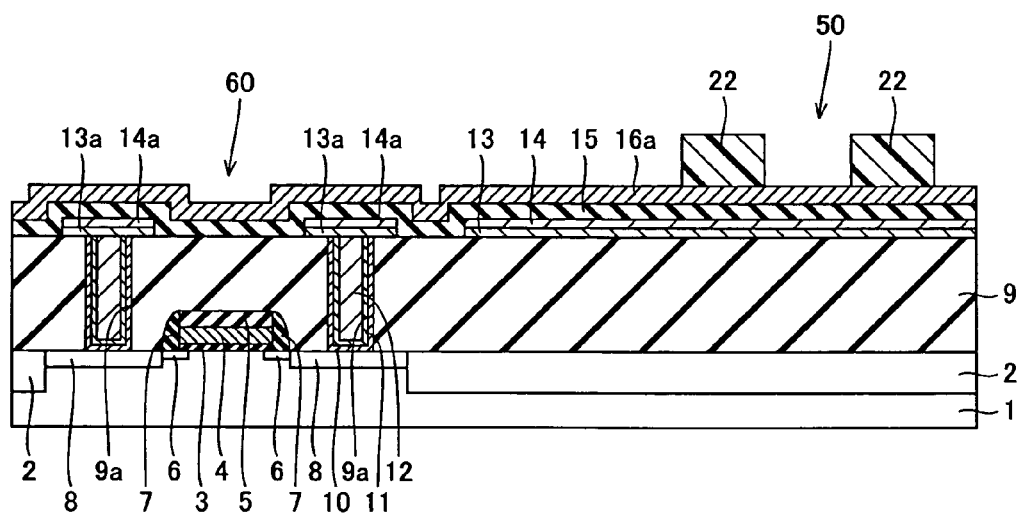

As shown in FIG. 9, a solution for SBT (SBT solution) is applied to the overall surface by spin coating at 2000 rpm for about 30 seconds. Heat treatment is performed in the atmosphere at about 200° C. for about 15 minutes, thereby evaporating solvent components such as ethanol and ethylhexane. Thereafter an annealing step is carried out in an oxygen atmosphere at about 650° C. for about 1 hour. The spin coating of the SBT solution and the heat treatment are repeated until the thickness of the ferroelectric film 15 reaches about 200 nm. Thereafter a Pt film 16a is formed by sputtering with a thickness of about 200 nm, and photoresist films 22 are formed on prescribed regions of the Pt film 16a.

Figure 10:
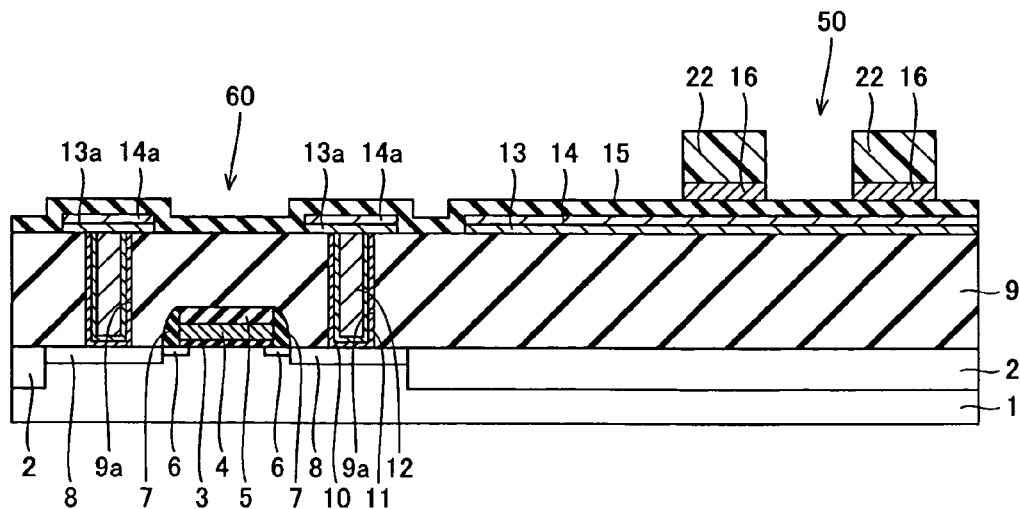

The photoresist films 22 are employed as masks for etching the Pt film 16a by dry etching with Cl$_2$/Ar gas, thereby forming the upper electrodes 16 of patterned Pt as shown in FIG. 10. In this state, the surface of the ferroelectric film 15 is corroded with the Cl$_2$/Ar gas employed for etching the Pt film 16a.

Figure 11:
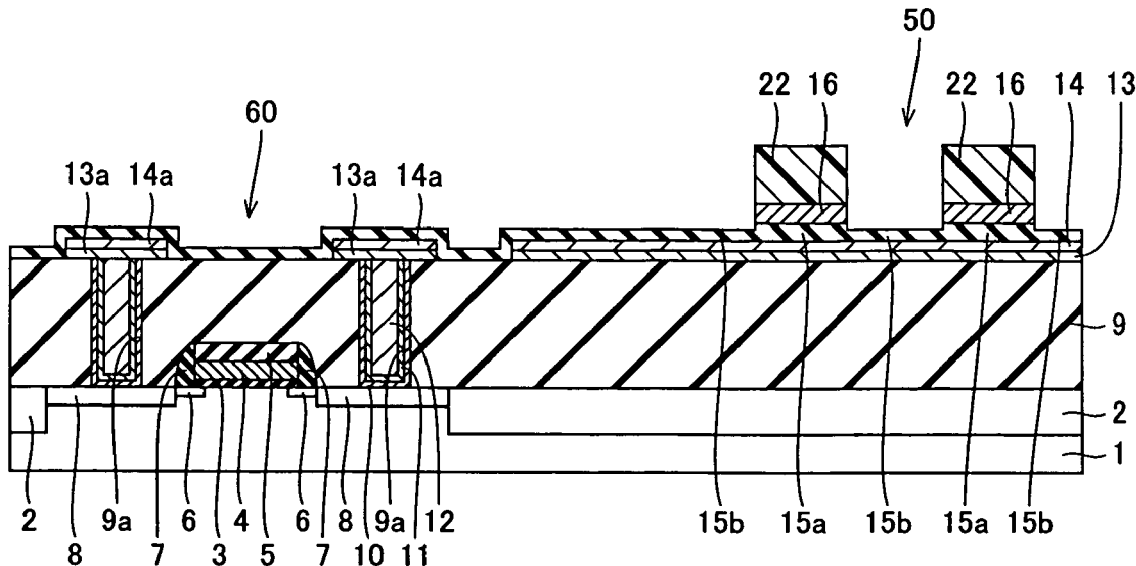

From this state, the surface of the ferroelectric film 15 is partially removed by etching through the photoresist films 22 serving as masks by dry etching with CF$_4$/Ar gas containing no chlorine-based gas so that the thickness of the ferroelectric film 15 (the thin-film parts 15b) is at least about 15% and not more than about 95% according to this embodiment, as shown in FIG. 11. Thus, the corroded portion is removed from the surface of the ferroelectric film 15, which in turn is formed with the storage parts 15a and the thin-film parts 15b. Thereafter the photoresist films 22 are removed.

Figure 12:
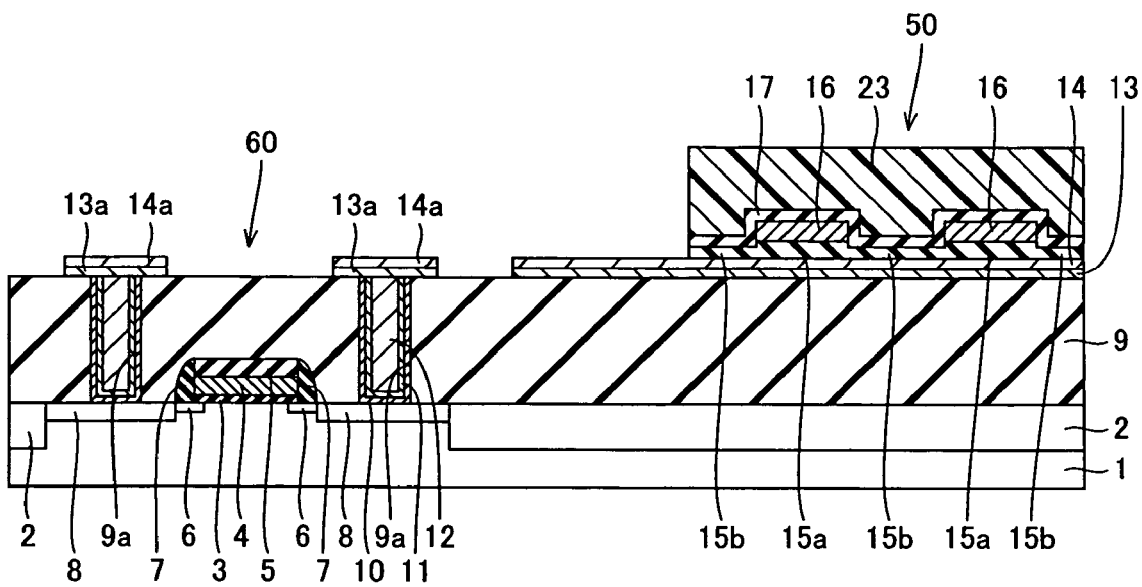

As shown in FIG. 12, the silicon nitride film 17 is deposited by sputtering with the thickness of about 10 nm to about 50 nm, and a photoresist film (etching mask) 23 is formed on a prescribed region of the silicon nitride film 17. The photoresist film 23 is employed as a mask for dry-etching the silicon nitride film 17 with CF$_4$ gas and thereafter dry-etching the thin-film parts 15b of SBT with CF$_4$/Ar gas, thereby patterning the storage parts 15a and the thin-film parts 15b of the ferroelectric film 15. According to the first embodiment, the thin-film parts 15b of the ferroelectric film 15 are patterned not to be present in the vicinity of the via hole 18b for connecting the memory cell array region 50 with the connecting wires. Thereafter the photoresist film 23 is removed.

Figure 13:
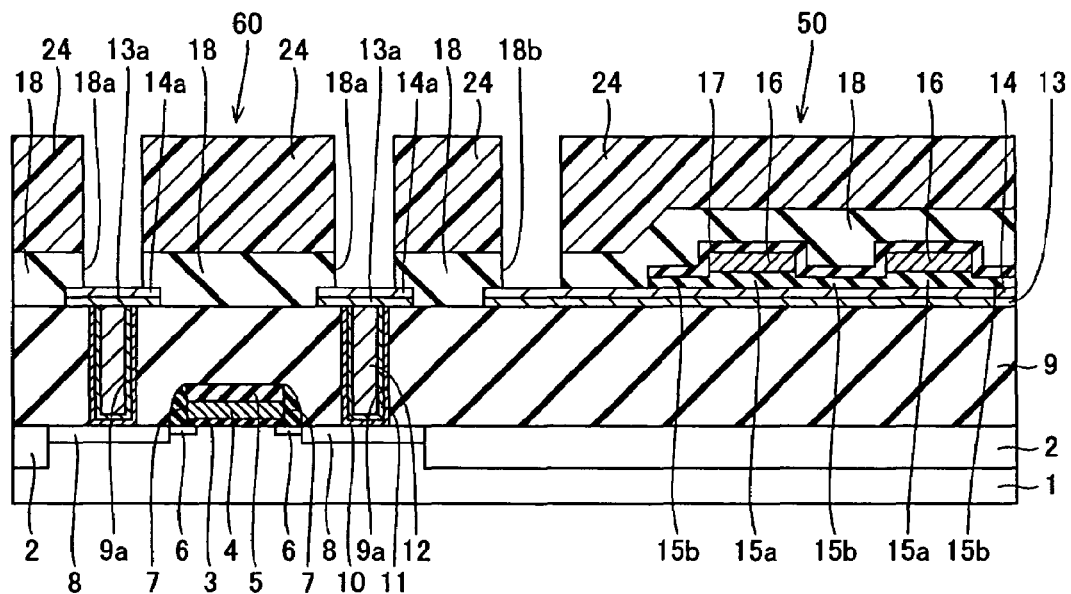

As shown in FIG. 13, the silicon oxide film (interlayer dielectric film) 18 is deposited by plasma CVD to cover the overall surface with a thickness of about 40 nm. Photoresist films 24 are formed on prescribed regions of the silicon oxide film 18 and thereafter employed as masks for etching the silicon oxide film 18, thereby forming the via holes 18a and 18b in the silicon oxide film 18. At this time, no thin-film parts 15b of the ferroelectric film 15 are present in the vicinity of the via hole 18b for connecting the memory cell array region 50 with the connecting wires, whereby the ferroelectric film 15 of hardly etched SBT may not be etched in the etching step for forming the via hole 18b. Thus, the via hole 18b can be easily formed. Thereafter the photoresist films 24 are removed.

Finally, the TiN films 19 having the thickness of about 15 nm and the Al films 20 having the thickness of about 200 nm are deposited by sputtering and thereafter patterned by photolithography and dry etching, as shown in FIG. 1. Thus, the TiN films 19 and the Al films 20 form the connecting wires for connecting the memory cell array region 50 and the peripheral circuit region 60 with each other. The simple matrix ferroelectric memory according to the first embodiment is formed in the aforementioned manner.

(Second Embodiment)

Figure 14:
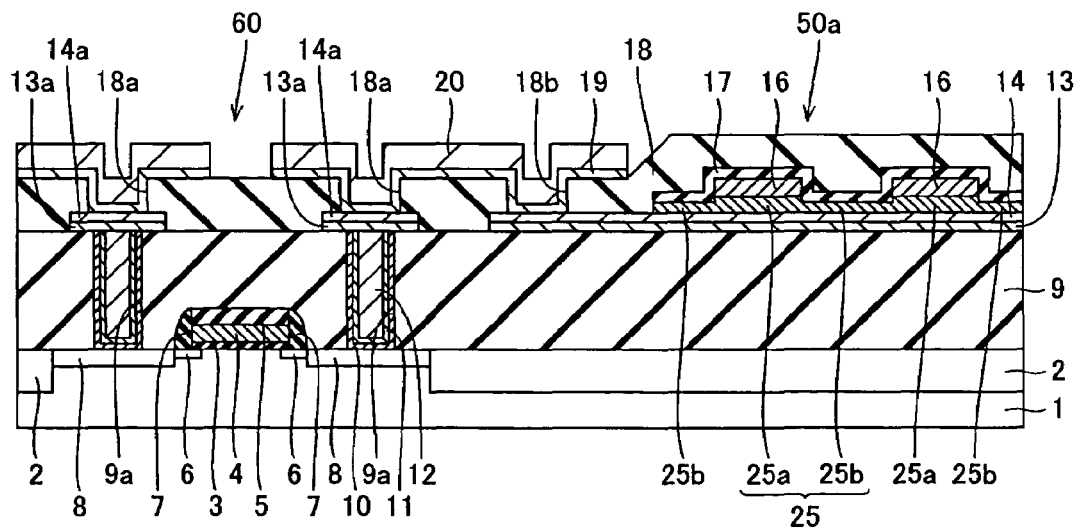
FIG. 14 is a sectional view showing a nonvolatile memory employing a cross-point colossal magnetoresistance material according to a second embodiment of the present invention.

Referring to FIG. 14, the present invention is applied to a nonvolatile memory employing a colossal magnetoresistance material for a storage material film in a second embodiment of the present invention, dissimilarly to the aforementioned first embodiment.

More specifically, a PCMO (Pr$_{0.7}$Ca$_{0.3}$MnO$_3$) film 25 of a colossal magnetoresistance material is employed in the nonvolatile memory according to the second embodiment, in place of the ferroelectric film 15 of SBT according to the first embodiment shown in FIG. 1. The PCMO film 25 is an example of the "storage material film" in the present invention. This PCMO film 25 includes storage parts 25a of about 200 nm in thickness located under upper electrodes 16 and thin-film parts 25b having a thickness of at least about 15% and not more than about 95% of the thickness of the storage parts 25a. A lower electrode consisting of an IrSiN film 13 and a Pt film 14, the PCMO film 25 and the upper electrodes 16 of Pt constitute resistive elements for storing data. More specifically, the nonvolatile memory employing the colossal magnetoresistance film (PCMO film 25) according to the second embodiment holds data through variation in the resistance value of the PCMO film 25 held between the upper electrodes 16 and the lower electrode.

According to the second embodiment, as hereinabove described, the colossal magnetoresistance film (PCMO film 25) is formed to be provided with the storage parts 25a located under the upper electrodes 16 and the thin-film parts 25b having the thickness smaller than that of the storage parts 25a so that, also when the surfaces of the thin-film parts 25b are partially corroded with chlorine-based etching gas employed for etching the upper electrodes 16, the thin-film parts 25b can resistively function against transverse electric fields from the upper electrodes 16 if the corroded surface portions of the thin-film parts 25b are removed by etching. Thus, the strength of signals read from memory cells can be improved, thereby improving signal reading accuracy.

The remaining effects of the second embodiment are similar to those of the first embodiment.

(Third Embodiment)

Figure 15:
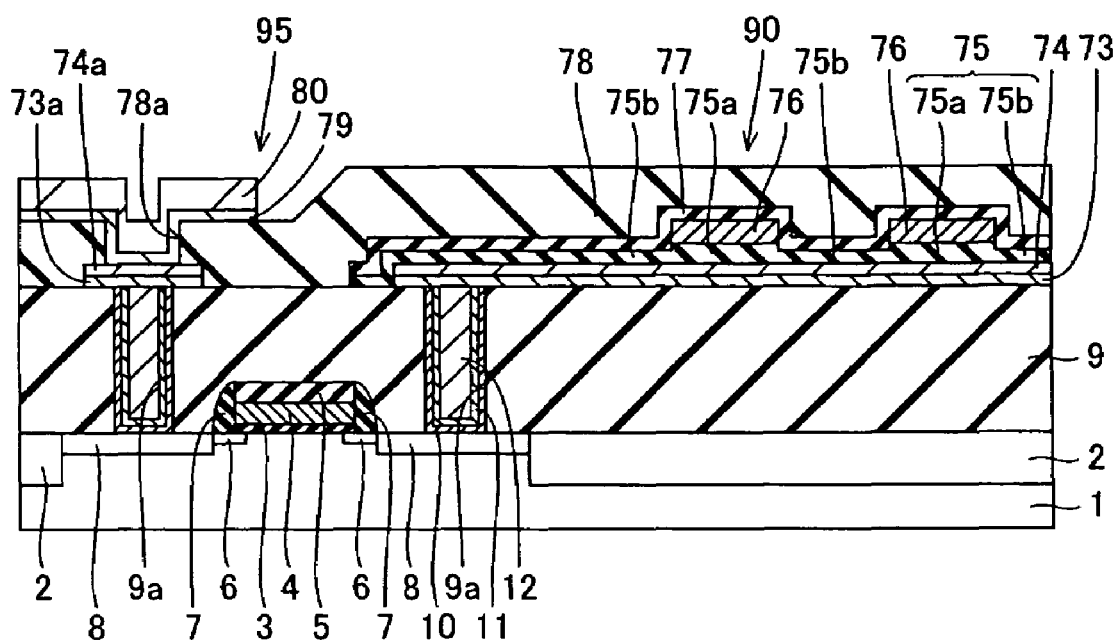
FIG. 15 is a sectional view showing a simple matrix ferroelectric memory according to a third embodiment of the present invention.
Figure 16:
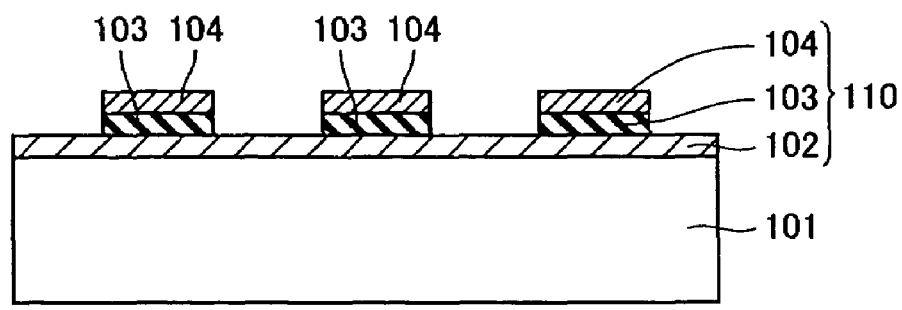
FIG. 16 is a sectional view showing the structure of a conventional simple matrix ferroelectric memory.
Figure 17:
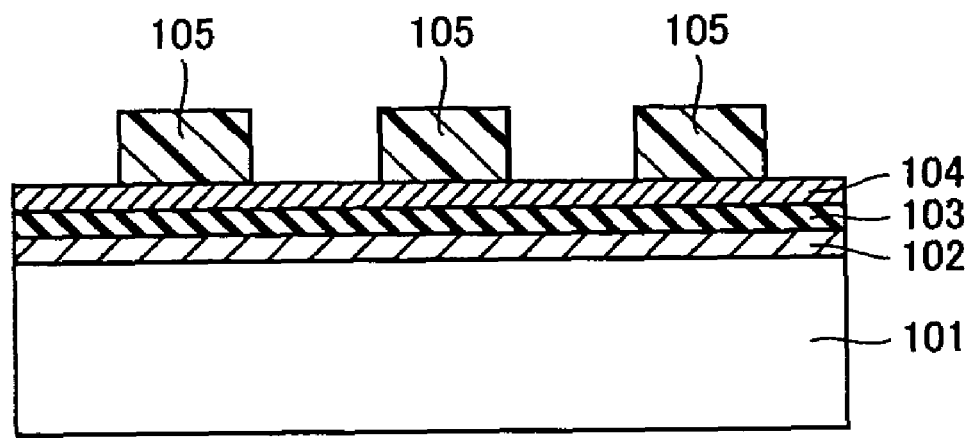
FIGS. 17 and 18 are sectional views for illustrating a process of fabricating the conventional simple matrix ferroelectric memory shown in FIG. 16.
Figure 18:
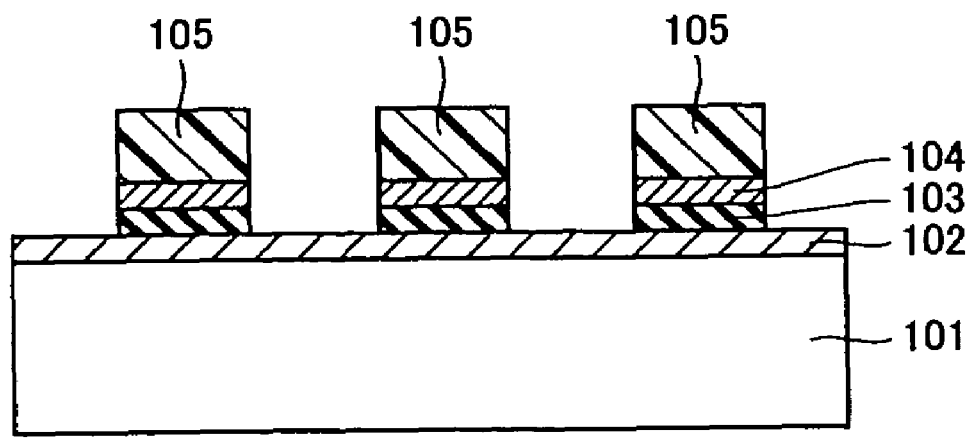

Referring to FIG. 15, a simple matrix ferroelectric memory according to a third embodiment of the present invention is similar in structure to the aforementioned simple matrix ferroelectric memory according to the first embodiment, except that a lower electrode is directly connected to tungsten plugs 12 and a ferroelectric film 75 covers the upper and side surfaces of the lower electrode.

More specifically, the simple matrix ferroelectric memory according to the third embodiment includes a memory cell array region 90 and a peripheral circuit region 95, as shown in FIG. 15. A p-type silicon substrate 1, element isolation regions 2, a gate insulator film 3, a gate electrode 4, a silicon oxide film 5, extension regions (low-concentration impurity regions) 6, side wall insulator films 7, high-concentration impurity regions 8, an interlayer dielectric film 9, Ti films 10, TiN films 11 and the tungsten plugs 12 are similar in structure (composition and thickness) to those of the simple matrix ferroelectric memory according to the aforementioned first embodiment.

According to the third embodiment, an IrSiN film 73 having a thickness of about 100 nm is formed on a region of the interlayer dielectric film 9 corresponding to the memory cell array region 90. This IrSiN film 73 is formed to extend onto the tungsten plugs 12, and is directly in contact with the tungsten plugs 12. The IrSiN film 73 functions as an oxygen barrier film inhibiting oxygen from diffusion. A Pt film 74 having a thickness of about 100 nm is formed on the IrSiN film 73. The IrSiN film 73 and the Pt film 74 form a lower electrode of ferroelectric capacitors. The lower electrode is an example of the "first electrode film" in the present invention. Another IrSiN film 73a and another Pt film 74a are formed on the tungsten plug 12 provided in the peripheral circuit region 95 by patterning the same layers as the IrSiN film 73 and the Pt film 74 of the memory cell array region 90.

According to the third embodiment, the ferroelectric films 75 of SBT ($SrBi_2Ta_2O_9$) is formed to cover the upper and side surfaces of the lower electrode consisting of the IrSiN film 73 and the Pt film 74 in the memory cell array region 90. Upper electrodes 76 of Pt having a thickness of about 200 nm are formed on prescribed regions of the upper surface of the ferroelectric film 75. The ferroelectric film 75 is an example of the "storage material film" in the present invention, and the upper electrodes 76 are examples of the "second electrode film" in the present invention.

According to the third embodiment, the ferroelectric film 75 is constituted of storage parts 75a located under the upper electrodes 76 with a thickness of about 200 nm and thin-film parts 75b located on regions of the Pt film 74 other than those formed with the storage parts 75a with a thickness of at least about 15% and not more than about 95% of the thickness of the storage parts 75a on the average.

The lower electrode consisting of the IrSiN film 73 and the Pt film 74, the storage parts 75a of the ferroelectric film 75 and the upper electrodes 76 constitute ferroelectric capacitors each constituting a memory cell.

According to the third embodiment, a silicon nitride film 77 is formed to cover the upper electrodes 76 and the thin-film parts 75b of the ferroelectric film 75. The silicon nitride film 77 is so provided as to prevent a photoresist film from coming into contact with the thin-film parts 75b in a step of patterning the thin-film parts 75b. This silicon nitride film 77 also has a function for serving as a hydrogen diffusion barrier inhibiting hydrogen from diffusion. The silicon nitride film 77 is an example of the "insulator film" in the present invention.

An interlayer dielectric film 78 of silicon oxide is formed to cover the overall surfaces of the memory cell array region 90 and the peripheral circuit region 95. A via hole 78a is formed in a region of the interlayer dielectric film 78 corresponding to the peripheral circuit region 95. A TiN film 79 having a thickness of about 15 nm is formed to come into contact with the Pt film 74a of the peripheral circuit region 95 in the via hole 78a. An Al film 80 having a thickness of about 200 nm is formed on the TiN film 79.

According to the third embodiment, as hereinabove described, the ferroelectric film 75 of SBT ($SrBi_2Ta_2O_9$) is so formed as to cover the upper and side surfaces of the lower electrode consisting of the IrSiN film 73 and the Pt film 74 in the memory cell array region 90, whereby the lower electrode (Pt film 74) of the ferroelectric capacitors (memory cells) can be prevented from application of etching damage in a step of etching the insulator film 77 and the ferroelectric film 75. Therefore, superior electric characteristics such as the resistance of the lower electrode can be obtained by forming the Ir SiN film 73 constituting the lower electrode of the ferroelectric capacitors (memory cells) to directly come into contact with the tungsten plugs 12 as compared with a case of connecting the lower electrode and the tungsten plugs 12 with each other through wires.

Etching damage is applied to the Pt film 74a of the peripheral circuit region 95 in the step of etching the insulator film 77 and the ferroelectric film 75. However, the Pt film 74a is connected with the TiN film 79 and the Al film 80 to be electrically connected with the tungsten plug 12 provided in the peripheral circuit region 95 after the step of etching the insulator film 77 and the ferroelectric film 75, and hence the electric characteristics are only slightly influenced by the etching damage.

Although the present invention has been described and illustrated in detail, it is clearly understood that the same is by way of illustration and example only and is not to be taken by way of limitation, the spirit and scope of the present invention being limited only by the terms of the appended claims.

For example, while the Pt film 14 is employed for forming the upper layer of the lower electrode in each of the aforementioned embodiments, the present invention is not restricted to this but the Pt film 14 may alternatively be replaced with an Ir film, a Pd film, a Co film, an Rh film, an Re film, an Mo film or an Ru film.

While the IrSiN film 13 is employed for forming the lower layer of the lower electrode in each of the aforementioned embodiments, the present invention is not restricted to this but the IrSiN film 13 may alternatively be replaced with a $TiO_2$ film, a CoSiN film, an RuSiN film, a Ti film, a $Pt/TiO_2$ film, a TaSiN film, a Pt film, an $IrO^2$ film of a TiN film.

While the ferroelectric film 15 or 75 is prepared from an SBT ($SrBi_2Ta_2O_9$) film in each of the aforementioned first and third embodiments, the present invention is not restricted to this but the ferroelectric film 15 or 75 may alternatively be prepared from another ferroelectric film such as an SBTN ($Sr_xBi_y(Nb,Ta)_2O_9$) film, a PZt (Pb(Zr,Ti)

$O_2$) film, a PLZT ((Pb,La)(Zr,Ti)$O_3$) film or a BLT ((Bi,La)$_4$Ti$_3$O$_{12}$) film or an organic ferroelectric film such as that of a vinylidene fluoride ethylene trifluoride copolymer.

While the PCMO film 25 is employed as the colossal magnetoresistance film in the aforementioned second embodiment, the present invention is not restricted to this but a colossal magnetoresistance film other than the PCMO film 25 may alternatively be employed.

While the ferroelectric film 15 or 75 or the PCMO film 25 is employed as the storage material film located between the upper electrodes 16 and the lower electrode in each of the aforementioned embodiments, the present invention is not restricted to this but the storage material film may alternatively consist of still another material. For example, the storage material film may alternatively consist of a resistivity change film of an organic material or a film of chalcogenide (Ge$_2$Sb$_2$Te$_5$, for example).

While the silicon nitride (SiN) film 17 or 77 is formed as the insulator film covering the surfaces of the thin-film parts 15b or 75b in each of the aforementioned first and third embodiments, the present invention is not restricted to this but the surfaces of the thin-film parts 15b or 75b may alternatively be covered with an insulator film of SiON or SiO$_2$. Also in this case, the insulator film can prevent the photoresist film from coming into contact with the thin-film parts 15b or 75b when patterning the thin-film parts 15b. While the SiON film has a function of inhibiting hydrogen from diffusion similarly to the SiN film, the SiO$_2$ film has no function of inhibiting hydrogen from diffusion.

While each of the aforementioned embodiments has been described with reference to the simple matrix ferroelectric memory or the nonvolatile memory, the present invention is not restricted to this but is also applicable to a one-transistor one-capacitor ferroelectric memory or the like.

What is claimed is:

1. A memory comprising:
   a first electrode film which inhibits oxygen diffusion;
   a storage material film, formed on said first electrode film, provided with a storage part and a thin-film part having a thickness, smaller than the thickness of said storage part, on at least about 15% of the thickness of said storage part of the average;
   a second electrode film formed on said storage part of said storage material film.

2. The memory according to claim 1 wherein said thin-film part has a thickness of not more than about 95% of the thickness of said storage part on the average.

3. The memory according to claim 1, wherein said first electrode film includes a first lower electrode film and a second lower electrode film formed on said first lower electrode film.

4. The memory according to claim 1, wherein said storage material film is either a ferroelectric film or a colossal magnetoresistance film.

5. The memory according to claim 1, further comprising:
   a transistor having pair of source/drain regions, and
   a metal plug connected to one of said source/drain regions of said transistor, wherein
   said first electrode film is formed to come into contact with said metal plug.

6. The memory according to claim 1, further comprising an insulator film formed to cover said second electrode film and said thin-film part of said storage material film against an etching mask employed for working said thin-film part of said storage material film.

7. The memory according to claim 6, wherein said insulator film includes a film having a function of inhibiting hydrogen from diffusion.

8. A memory comprising:
   a first electrode film;
   a storage material film, formed on said first electrode film, provided with a storage part and a thin-film part having a thickness, smaller than the thickness of said storage part, of at least about 15% of the thickness of said storage part on the average;
   a second electrode film formed on said storage part of said storage material film;
   a memory cell array region formed with said storage material film;
   a peripheral circuit region; and
   a connecting wire for connecting said memory cell array region and said peripheral circuit region with each other, wherein
   said storage material film is so patterned that no said thin-film part of said storage material film is present at least in the vicinity of a region connecting said memory cell array region and said connecting wire with each other.

9. The memory according to claim 8, further comprising an interlayer dielectric film covering at least a portion close to said region connecting said memory cell array region and said connecting wire with each other having an opening, wherein
   said first electrode film of said memory cell array region and said connecting wire are connected with each other through said opening.

10. A memory comprising:
    a first electrode film;
    a storage material film, formed on said first electrode film, provided with a storage part and a thin-film part having a thickness, smaller than the thickness of said storage part, of at least about 15% of the thickness of said storage part on the average;
    a second electrode film formed on said storage part of said storage material film, wherein said first electrode film includes a first lower electrode film and a second lower electrode film formed on said first lower electrode film, and wherein said first lower electrode film has a function of inhibiting oxygen from diffusion.

11. A memory comprising:
    a first electrode film;
    a storage material film, formed on said first electrode film, provided with a storage part and a thin-film part having a thickness, smaller than the thickness of said storage part, on at least about 15% of the thickness of said storage part of the average;
    a second electrode film formed on said storage part of said storage material film, wherein said storage material film is formed to cover the upper surface and the side surfaces of said first electrode film.

* * * * *